United States Patent
Glew et al.

(10) Patent No.: US 7,060,516 B2
(45) Date of Patent: Jun. 13, 2006

(54) METHOD FOR INTEGRATING OPTICAL DEVICES IN A SINGLE EPITAXIAL GROWTH STEP

(75) Inventors: Rick W. Glew, Manotick (CA); Ian B. Betty, Ottawa (CA); Jonathan Greenspan, Nepean (CA)

(73) Assignee: Bookham Technology, PLC, Abingdon (GB)

( * ) Notice: Subject to any disclaimer, the term of this patent is extended or adjusted under 35 U.S.C. 154(b) by 0 days.

(21) Appl. No.: 10/676,976

(22) Filed: Sep. 30, 2003

(65) Prior Publication Data

US 2004/0147053 A1    Jul. 29, 2004

Related U.S. Application Data

(60) Provisional application No. 60/414,402, filed on Sep. 30, 2002.

(51) Int. Cl.
*H01L 21/36* (2006.01)

(52) U.S. Cl. .......................................... 438/31; 438/494

(58) Field of Classification Search .................. 438/31, 438/481, 494, 507, 695; 117/58, 95, 104
See application file for complete search history.

(56) References Cited

U.S. PATENT DOCUMENTS

| | | | | | |
|---|---|---|---|---|---|
| 3,400,309 | A | * | 9/1968 | Doo | 257/506 |
| 3,574,008 | A | * | 4/1971 | Rice | 438/481 |
| 4,826,784 | A | * | 5/1989 | Salerno et al. | 438/23 |
| 4,948,751 | A | * | 8/1990 | Okamoto et al. | 438/507 |
| 5,438,215 | A | * | 8/1995 | Tihanyi | 257/401 |
| 5,728,215 | A | * | 3/1998 | Itagaki et al. | 117/104 |
| 6,174,748 | B1 | * | 1/2001 | Jeon et al. | 438/31 |
| 6,406,982 | B1 | * | 6/2002 | Urakami et al. | 438/492 |
| 6,495,294 | B1 | * | 12/2002 | Yamauchi et al. | 438/597 |

* cited by examiner

*Primary Examiner*—Stephen W. Smoot
(74) *Attorney, Agent, or Firm*—Lahive & Cockfield, LLP; Anthony A. Laurentano, Esq.

(57) ABSTRACT

A method for integrating optical devices in a single growth step by utilizing a combination of Selective Area Growth and Etch (SAGE) is provided. An first device is formed between a set of oxide-masked regions, whilst a second device is formed in an adjacent planar region. By use of Selected Area Growth and Etch (SAGE), in which the growth between the oxide-masked regions is greater than the growth in the planar region, and in which the etch rate in the area between the oxide-masked regions is substantially the same as that in the planar region, the number of active quantum layers for the first device are formed between the oxide-masked regions, and a different number of layers for the second device is formed in the planar region.

14 Claims, 4 Drawing Sheets

METHOD FOR INTEGRATING OPTICAL DEVICES IN A SINGLE EPITAXIAL GROWTH STEP

RELATED APPLICATIONS

The present invention claims priority to U.S. Provisional Patent Application Ser. No. 60/414,402 filed Sep. 30, 2002, the contents of which are herein incorporated by reference.

FIELD OF THE INVENTION

The invention relates to integrated optics and more particularly to methods of epitaxial growth for integration of optical devices.

BACKGROUND OF THE INVENTION

As optoelectronics progresses from discrete components to monolithic photonic integrated circuits, many building blocks will be utilized. One can envisage a single chip containing several active devices (various components) linked together with passive devices (for example waveguides). The technology by which the active components join the passive components, the Butt-coupling technology, is destined to be an important building block. At present there is no universally accepted technique to couple the optical devices. Although the general problem is one of integrating any device with any other device, a more common task is the integration of active devices and waveguides. Many techniques have been utilized to integrate active devices and waveguides on photonic integrated circuits, but each has its own problems.

The conventional method utilizes two growth steps to integrate an active device (for example a laser) with a waveguide. First, the active region of an active device is grown over all the substrate. The wafer is then removed from the growth apparatus, and the active device regions are masked and in regions where the waveguides are to be positioned the active device layers are removed by etching. The wafer is then returned to the growth apparatus for a second time during which the waveguide is grown in the etched regions, thus forming a butt-coupled waveguide for the active device. There are numerous problems associated with this method. The primary problem is that the interface between for example a laser and a waveguide is of poor quality and the shape of it is non-ideal. This is due primarily to growth problems at the interface during the step of growing the waveguide, and results in low coupling efficiencies and large reflections at the interface which are not ideal for most active devices. Moreover, this method is not favored for production because the process has numerous operations, many of which are difficult to reproduce. The cost of production also increases with the number of processing operations and growth steps, and hence a multiple operation and multiple growth method is not preferable.

Another proposed method, which has been demonstrated in GaAlAs materials, is to form a step in the substrate and to grow a structure over the step such that the active layer is aligned to the waveguide. This method is very attractive because it utilizes a single epitaxial step, however the coupling efficiency is small and the losses are large because the active layer is present in the passive section. In addition, this method has not been demonstrated in the InP/GaInAsP materials system and is unlikely in the near future to be demonstrated with any success.

Another alternative method is to grow the quantum well active region, mask the active regions and intermix the quantum wells such that they are transparent to the laser wavelength. There are several quantum well intermixing techniques such as impurity induced, impurity-free, implantation induced and laser induced intermixing. Today the Impurity-free vacancy disordering technique is fashionable in the literature. At present however the method has not been widely tested.

It would be desirable for there to be a method of integrating optical devices which does not suffer from the above-mentioned problems, and which can be carried out in a single epitaxial growth step.

SUMMARY OF THE INVENTION

The present invention provides a method for integrating optical devices in a single growth step by utilizing a combination of Selective Area Growth and Etch (SAGE). A first device is formed between a set of oxide-masked regions, whilst a second device is formed in an adjacent planar region which does not contain oxide-mask structures. By use of Selected Area Growth and Etch (SAGE), in which the growth between the oxide-masked regions is greater than the growth in the planar region, and in which the etch rate in the area between the oxide-masked regions is substantially the same as that in the planar region, the number of active quantum layers for the first device are formed between the oxide-masked regions, and a different number of layers for the second device is formed in the planar region. The use of a single growth step process is a cost saving enhancement over multi-step processes.

According to a first broad aspect the invention provides for a method of forming a layer in a selected area on a wafer in a single growth step, the method comprising in a single growth step, performing the steps of forming a mask on a substrate of the wafer defining a selective area growth region coinciding with the selected area, the selective area growth region having a growth enhancement ratio of greater than one, growing a layer on the wafer such that a thickness of the layer in the selective area growth region is greater than a thickness of the layer elsewhere on the wafer, and etching the layer at an etching concentration and for a duration which leaves a thickness of the layer in the selective area growth region and removes the layer from elsewhere on the wafer.

In some embodiments of the invention the etching concentration is at least a concentration sufficiently high such that etching occurs at near kinetic limited conditions, wherein growing occurs as a result of Metalorganic Epitaxial Chemical Vapor Deposition, and wherein the mask is a dielectric mask.

According to a second broad aspect the invention provides for a method of integrating optical devices on a wafer in single growth step, the method comprising in a single growth step, performing the steps of forming a dielectric mask on a substrate of the wafer defining a selective area growth region for forming a first optical device in the selective area growth region, and a second optical device in an adjacent planar region, the selective area growth region having a growth enhancement ratio of greater than one, growing a first optical device layer in the selective area growth region and the planar region of the wafer with a thickness in the selective area growth region greater than a thickness in the planar region according to the growth enhancement ratio, and etching the first optical device layer at an etching concentration and for a duration which removes the first optical device layer from the planar region and leaves a thickness of the first optical device layer in the selective area growth region.

In some embodiments the etching concentration is such that the etching rate in the planar region is substantially equal to the etching rate in the selective area growth region.

Some embodiments of the invention provide for forming a common layer of both the first optical device and the second optical device by growing the common layer in the selective area growth region and the planar region, in which a step of forming a first optical device layer of only the first optical device comprises said step of growing the first optical device layer and said step of etching the first optical device layer.

Some embodiments of the invention provide for performing the steps of forming a first optical device layer a first prescribed number of times and forming a common layer a second prescribed number of times to form the first optical device and the second optical device.

In some embodiments of the invention the first optical device is an active device and the second optical device is a passive device.

In some embodiments of the invention the first optical device is a laser and the second optical device is a waveguide.

In some embodiments of the invention the first optical device is an active device and the second optical device is an active device.

In some embodiments of the invention the first optical device is a laser and the second optical device is an optical amplifier.

In some embodiments of the invention the etching concentration is at least a concentration sufficiently high such that etching occurs at near kinetic limited conditions, and wherein growing occurs as a result of Metalorganic Epitaxial Chemical Vapor Deposition.

In some embodiments of the invention the step of performing the steps of forming a first optical device layer a first prescribed number of times and forming a common layer a second prescribed number of times comprises forming a lower cladding layer as a common layer, forming a lower waveguide layer as a common layer, forming an upper waveguide layer as a common layer, and forming an upper cladding layer as a common layer.

In some embodiments of the invention the first optical device is a laser and the second optical device is a waveguide, the step of performing the steps of forming a first optical device layer a first prescribed number of times and forming a common layer a second prescribed number of times further comprising forming a barrier layer as a first optical device layer, forming a well layer as a first optical device layer, repeatedly performing the steps of forming a barrier layer and forming a well layer a preset number of times equal to the desired number of wells for the laser, and forming a barrier layer as a first optical device layer.

In some embodiments of the invention the step of performing the steps of forming a first optical device layer a first prescribed number of times and forming a common layer a second prescribed number of times further comprises forming a laser barrier layer as a first optical device layer, forming a laser well layer as a first optical device layer, repeatedly performing the steps of forming a laser barrier layer and forming a laser well layer a first preset number of times equal to a desired number of wells for the laser which exceed a number of wells for the amplifier, forming an amplifier and laser barrier layer as a common layer, forming an amplifier and laser well layer as a common layer, repeatedly performing the steps of forming an amplifier and laser barrier layer and forming an amplifier and laser well layer a second preset number of times equal to a desired number of wells for the amplifier, and forming an amplifier and laser barrier layer as a common layer.

According to a third broad aspect the invention provides for a method of forming a layer in a selected area on a wafer in single growth step, the method comprising in a single growth step, performing the steps of forming a mask on a substrate of the wafer defining a selective area growth region coinciding with the selected area, the selective area growth region having a growth enhancement ratio of greater than one, growing a layer on the wafer such that a thickness of the layer in the selective area growth region is greater than a thickness of the layer elsewhere on the wafer, and etching the layer at an etching concentration and for a duration which leaves a first thickness of the layer in the selective area growth region and a second thickness of the layer elsewhere on the wafer, wherein the ratio of the first thickness of the layer in the selective area growth region to the second thickness of the layer elsewhere on the wafer is smaller than the growth enhancement ratio.

Other aspects and features of the present invention will become apparent to those of ordinary skill in the art upon review of the following description of specific embodiments of the invention in conjunction with the accompanying figures.

BRIEF DESCRIPTION OF THE DRAWINGS

Preferred embodiments of the invention will now be described with reference to the accompanying diagrams, in which.

DETAILED DESCRIPTION OF THE PREFERRED EMBODIMENTS

Figure 1:
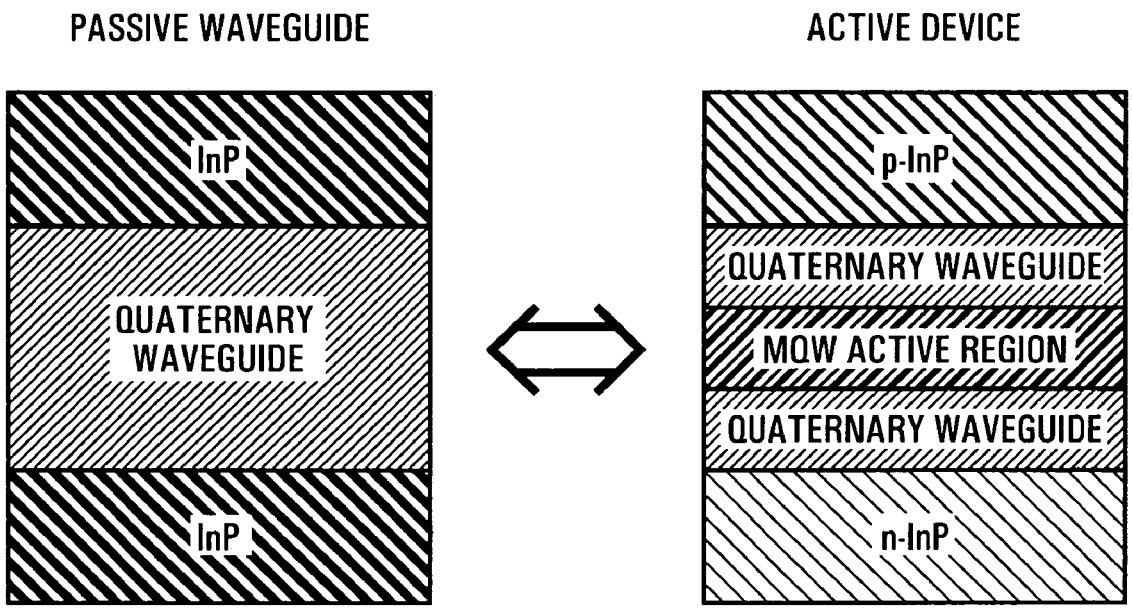
FIG. 1 is an illustration of the epitaxial layers involved in the integration of an active device with a passive waveguide.

Referring to FIG. 1, a first optical device (which in this example is a laser) and a second optical device (which in this example is a passive waveguide) to be integrated on a wafer according to the preferred embodiment of the invention are described. Shown in the figure are two regions which must be optically integrated, a passive waveguide region, and a region having an active device. The passive waveguide comprises a waveguide which for example may be a quaternary (GaInAsP) layer sandwiched between two layers of Indium Phosphide which serve as cladding. The composition of the quaternary layer is chosen such that it is transparent to the wavelength of the light to be guided. The active device consists of a quaternary waveguide surrounding a multi-quantum well active region. This structure is sandwiched between two layers of Indium Phosphide. The active device could be any structure that contains a quaternary waveguide and a multi-quantum active region such as a laser, detector, amplifier, spot-size-converter, modulator etc. For simplicity, we shall describe the integration of a laser and a waveguide.

It is very important to be able to couple the laser with the waveguide such that the loss and the reflections at the interface are as small as possible.

The general principle underlying the method according to the invention is that the epitaxial growth rate is faster in a region between oxide masked areas than in an adjacent planar region, whereas the etch rate in the region between the oxide masked areas is substantially equal to that in the planar region. In the preferred embodiment to accentuate the difference in growth rates of the different regions, and to ensure more similarity in etch rates of the regions, a relatively slow growth rate and a relatively high etch rate are respectively used. In this manner SAGE (selective area growth and etch) is used. Since the wafer is not removed from the growth apparatus during the growth and etching of various layers, the entire process is said to occur in a single growth step. The use of a single growth step according to the invention is preferable due to the cost improvement over multi-step processes.

Figure 2:
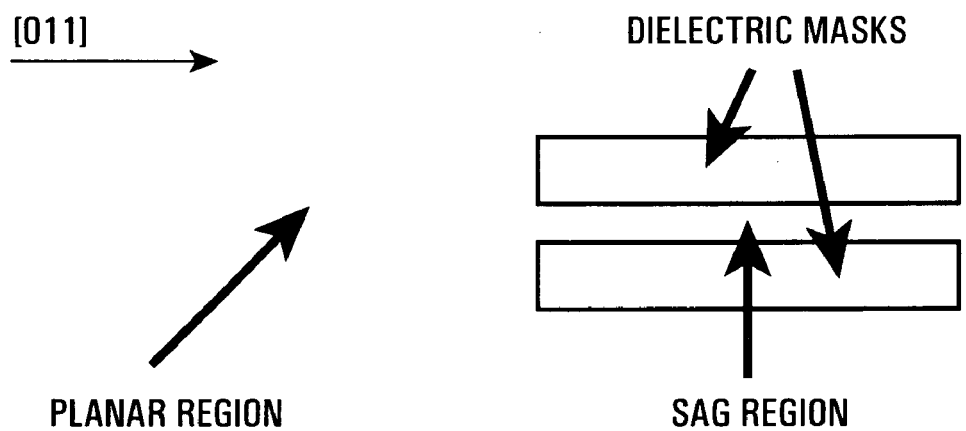
FIG. 2 is a top view illustrating the configuration of the dielectric mask used in the preferred embodiment of the invention.

Referring to FIG. 2, a configuration utilizing this principal is described. Two rectangular dielectric masks have been formed on the wafer, and are separated by an exposed rectangular semiconductor surface between them known as a Selective Area Growth (SAG) region. Also indicated in FIG. 2 is a planar region which is the remaining adjacent region of the substrate. The ratio of the epitaxial growth rate in the SAG region to the epitaxial growth rate in the planar region is known as the Growth Enhancement Ratio (GER). The value of the GER depends on the dielectric geometry and the growth conditions. The value of the GER increases with increasing dielectric width and decreasing gap. As mentioned above the GER also increases with lower deposition rates. The preferred embodiment utilizes Metalorganic Epitaxial Chemical Vapor Deposition (MECVD) to achieve a large GER. For simplicity we shall assume that the dielectric mask geometry indicated in FIG. 2, results in a GER of 2.

The dielectric mask can be formed from a variety of materials, such as silicon dioxide or silicon nitride. The two dielectric masked regions are usually rectangular and are typically 40 microns wide, 500 microns long and spaced 20 microns, orientated parallel to the [011] direction, as shown in FIG. 2.

Figure 3:
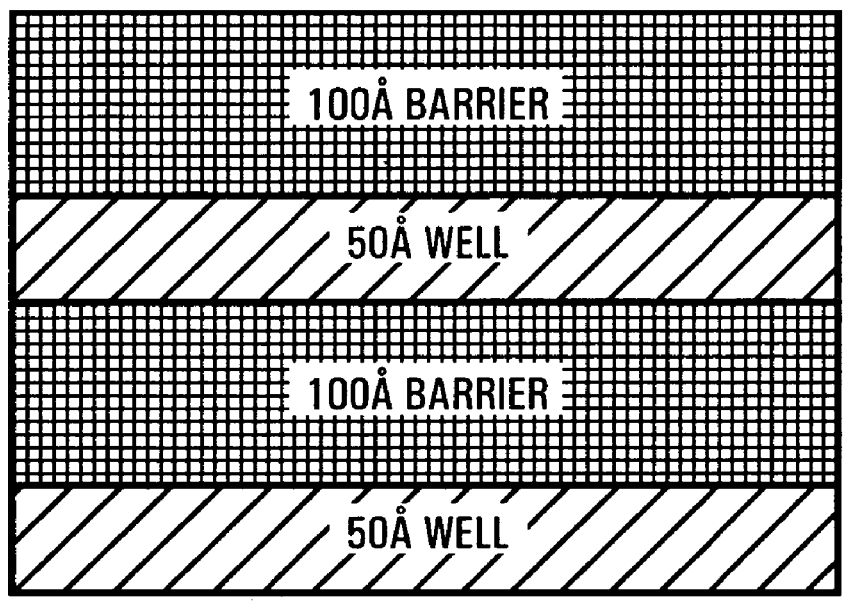
FIG. 3 is an example illustration of the layers which make up the active region of a laser.
Figure 3:
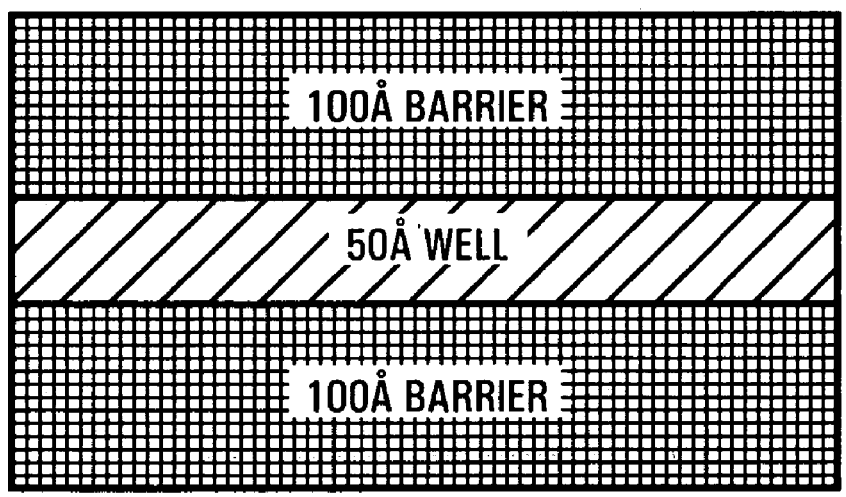

FIG. 3 illustrates the active region of a multi-quantum well laser which consists of a series of identical quantum wells sandwiched between a series of identical barriers. Typically there are 6 quantum wells, the number depending on device design. The thickness and composition of the wells and barriers depends on the laser design, in this example the wells are 50 A (angstroms) thick and the barriers are 100 A thick. The quaternary waveguide, the barriers and the quantum wells of the example active device are all composed of $Ga_xIn_{1-x}As_yP_{1-y}$ but differ in their values of x and y.

Referring to FIG. 4, the steps of the preferred embodiment to grow an integrated laser and waveguide using low pressure MOCVD (Metalorganic Epitaxial Chemical Vapor Deposition) are described.

First, a dielectric mask defining an SAG region is formed on the substrate of the wafer.

Next, an InP cladding layer is grown on the wafer in both the planar and SAG regions, after which a lower quaternary waveguide is grown on the wafer in both the planar and SAG regions. These layers are common layers in that they are to be present in both the completed laser and the waveguide.

Figure 4A:
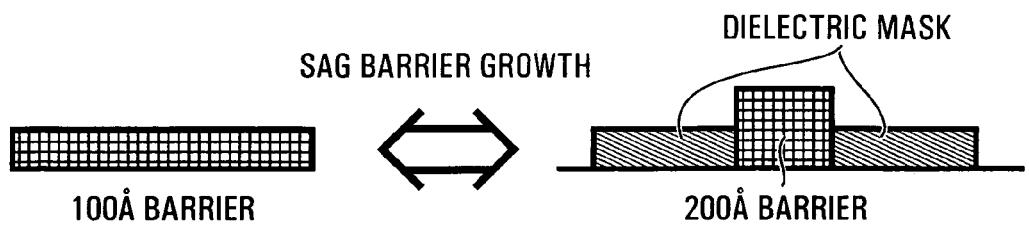
FIG. 4 illustrates the process of growing the active device in a single epitaxial growth step according to the preferred embodiment.
Figure 4B:
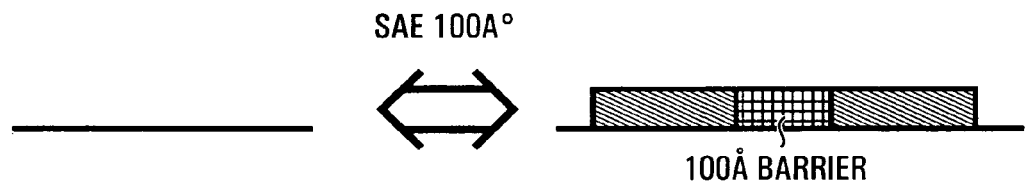

Next, a barrier to be used in the laser is grown in both the planar and SAG regions of the wafer. The growth conditions and time of depositing will be such that the barrier is 200 A thick in the SAG region between the dielectric masks and 100 A thick in the planar region, as shown in FIG. 4a. The barrier is then etched in both the planar and SAG regions, as shown in FIG. 4b. The etch conditions and time of etching will be such that 100 A of the barrier in the planar region and 100 A of the barrier in the SAG region is removed, thus leaving no barrier in the planar region and a 100 A barrier in the SAG region. A variety of etchants can be used, such as HCl, $CBr_4$ or $CH_3Cl$. It is preferable that the etching is performed under kinetic limited conditions. Under kinetic limited conditions the etch rate is limited by the reaction rate between the etchant and the layer, whereas at lower etch concentrations the etching rate is limited by the rate at which the etchant arrives at the surface of the layer. Use of the term "near kinetic limited conditions" will refer to conditions reached by sufficiently high etch concentration such that the rate at which the etchant arrives at the surface of the layer is nearly the same as the reaction rate at the surface. The etch rate between the SAG masks and in the planar regions are identical under kinetic limited conditions. Etch rates which under typical conditions create substantially equal etch rates in the SAG and planar region are relatively high for example on the order of 6 microns/hour or greater. It should be understood that when etch rates are substantially equal they are, for the purposes of creating layers of desired thickness by etching, "insignificantly different".

It should be understood that the etch rate in the SAG region and the etch rate in the planar region need not be substantially equal for the invention to work. At low Etch concentration the etch rate in the SAG region is larger than the etch rate in the planar region, and hence a greater thickness of a grown layer is removed in the SAG region than in the planar region. As etch concentration increases, the ratio between the etch rate in the SAG region to the etch rate in the planar region approaches unity. It is always possible to completely remove the layer formed in the planar region while still leaving some thickness of a layer in the SAG region if the ratio between the etch rate in the SAG region to the etch rate in the planar region is not grater than the GER. For example, suppose the etch concentration were such that the ratio between the etch rate in the SAG region and that in the planar region were 1.5. Assuming a GER of 2, a layer grown in both regions would have a thickness of 2 X in the SAG region where X is the thickness of the layer in the planar region. If the portions of the layer in the planar region of thickness X were totally etched away, then a thickness of 1.5 X would be etched from the SAG region, leaving only a layer having a thickness of 0.5 X in the SAG region. One result of a ratio of etch rates which is not close to unity is that more of the layer deposited in the SAG region is wastefully removed. In order to maximize the thickness of the layer formed in the SAG region, and hence increase efficiency, it is preferable that the concentration is such that the etch rates are substantially equal in both regions. An example etch rate ratio which has been achieved in the laboratory, and is helpful in retaining an appreciable fraction of material in the SAG region, is a ratio of 10:9 between the etch rate in the SAG region and the etch rate in the planar region.

Figure 4C:
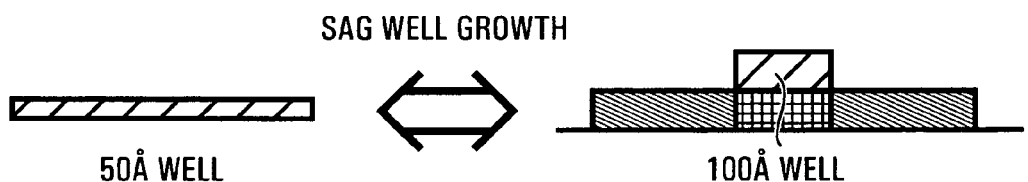
Figure 4D:

FIGS. 4c and 4d illustrate this process for the deposit and etching of a quantum well layer. In this case the growth conditions and time of depositing will be such that the well is 100 Å thick in the SAG region and 50 Å thick in the planar region, as shown in FIG. 4c. The well is then etched in both regions of the wafer with etch conditions and time of etching which result in 50 Å of the well in the planar region and 50 Å of the well in the SAG region being removed, thus leaving no well in the planar region and a 50 Å well in the SAG region, as shown in FIG. 4d.

The steps of growing and etching a barrier and growing and etching a well is performed several times so as to form the desired number of barriers and quantum wells for the laser.

An upper quaternary waveguide is then grown on the wafer in the planar and SAG regions, after which an upper InP cladding is grown in the planar and the SAG regions. The formation of these common layers complete the process of forming layers for the laser and the waveguide.

At this point growth is stopped, and the wafer is allowed to cool. Once cool, the wafer may be removed from the reactor and standard processing of the wafer may be commenced.

Figure 5:
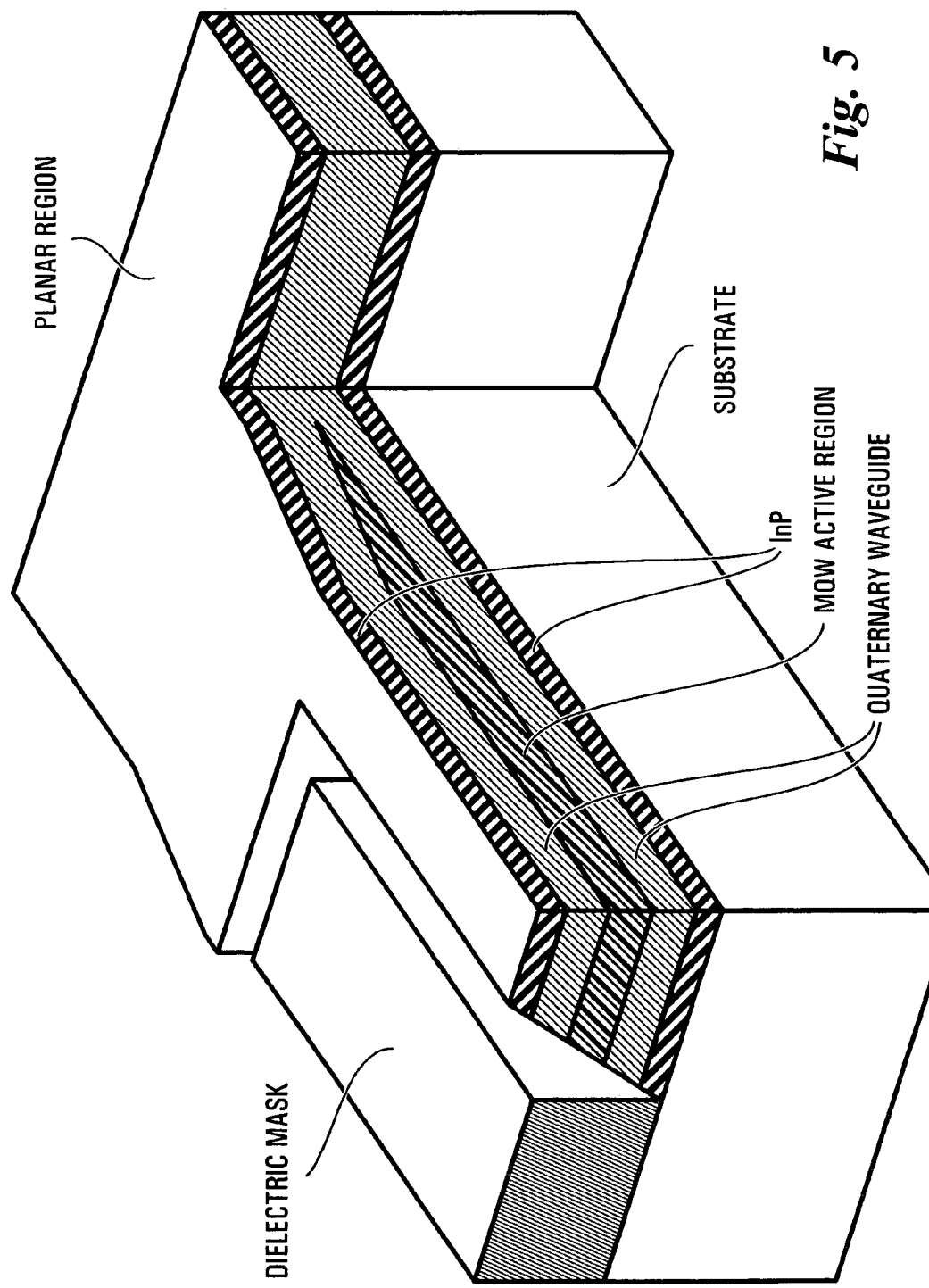
FIG. 5 is an isometric cut-away view of an integrated laser and waveguide constructed using the method according to the preferred embodiment.

FIG. 5 illustrates the resultant structure which contains wells and barriers in between the masked areas and no wells or barriers in the planar region. As can be seen, there is a taper of about 50 microns extending from the active device into the planar region where the waveguide is formed. This interface between the active device and the waveguide is not as problematic as that associated with other methods of integration.

It should be noted that the GER does not need to be 2 or in fact any other integer or any special number. In general as long as the GER is any number greater than 1, then there will always be more growth in the SAG region than in the planar region and hence there will an amount of etching which will be just enough to remove all growth of a layer in the planar region and yet leave some amount of growth of the layer in the SAG region.

It should be noted that in forming the layers of the laser, the barriers could be left intact (as common layers) if the composition of the barriers were the same as the waveguide or if they were an integral part of the waveguide design. In such a case, the growth of a barrier would not be accompanied by a corresponding etch step.

It also should be noted that the thickness of the quaternary waveguide in the waveguide section of the device can be adjusted with a combination of growth and etch.

It should be noted that although the preferred embodiment integrates a passive device (namely a waveguide) and an active device (namely a laser) the invention also contemplates the integration of active devices with each other, and in general any combination of active and passive devices. For example, this technique can be used to integrate a laser with an optical amplifier such that there are more wells in the laser than in the amplifier. In such an application, the planar region would serve as the amplifier region, and the SAG region would serve as the laser region. For an amplifier consisting of six layers of wells and barriers and a laser consisting of nine layers of wells and barriers one would simply grow three wells in the laser using selective area growth and etch while not forming any layers in the amplifier region. One would then proceed to grow six more layers of wells and barriers throughout the SAG and planar regions, resulting in the desired laser within the SAG region and the desired amplifier in the planar region.

It also should be noted that depending on the structure desired, the layers in the planar region, in addition to either being etched away or left alone, may be etched partially away. This may be used to obtain a layer thickness ratio greater than the GER generated by the growth alone, and yet without completely removing the layer deposited in the planar region.

Although in the preferred embodiment the cladding used is InP, other substances such as InGaAsP may be used.

Numerous modifications and variations of the present invention are possible in light of the above teachings. It is therefore to be understood that within the scope of the appended claims, the invention may be practiced otherwise than as specifically described herein.

We claim:

1. A method of forming a layer in a selected area on a wafer in a single growth step, the method comprising:
   in a single growth step, performing the steps of:
   forming a mask on a substrate of the wafer defining a selective area growth region coinciding with the selected area, the selective area growth region having a growth enhancement ratio of greater than one;
   growing a layer on the wafer such that a thickness of the layer in the selective area growth region is greater than a thickness of the layer elsewhere on the wafer; and
   etching the layer at an etching concentration and for a duration which leaves a thickness of the layer in the selective area growth region and removes the layer from elsewhere on the wafer,
   wherein the etching concentration is at least a concentration sufficiently high such that etching occurs at near kinetic limited conditions, wherein growing occurs as a result of Metalorganic Epitaxial Chemical Vapor Deposition, and wherein the mask is a dielectric mask.

2. A method according to claim 1 further comprising the step of, growing, after the step of etching, another layer on the wafer.

3. A method of integrating optical devices on a wafer in single growth step, the method comprising:
   in a single growth step, performing the steps of:
   forming a dielectric mask on a substrate of the wafer defining a selective area growth region for forming a first optical device in the selective area growth region, and a second optical device in an adjacent planar region, the selective area growth region having a growth enhancement ratio of greater than one;
   growing a first optical device layer in the selective area growth region and the planar region of the wafer with a thickness in the selective area growth region greater than a thickness in the planar region according to the growth enhancement ratio; and
   etching the first optical device layer at an etching concentration and for a duration which removes the first optical device layer from the planar region and leaves a thickness of the first optical device layer in the selective area growth region.

4. A method according to claim 3 wherein the etching concentration is such that the etching rate in the planar region is substantially equal to the etching rate in the selective area growth region.

5. A method according to claim 3 further comprising the step of:
   forming a common layer of both the first optical device and the second optical device by growing the common layer in the selective area growth region and the planar region;
wherein a step of forming a first optical device layer of only the first optical device comprises said step of growing the first optical device layer and said step of etching the first optical device layer.

6. A method according to claim 5 further comprising:
performing the steps of forming a first optical device layer a first prescribed number of times and forming a common layer a second prescribed number of times to form the first optical device and the second optical device.

7. A method according to claim 6 wherein the first optical device is a laser and the second optical device is a waveguide.

8. A method according to claim 7 wherein the step of performing the steps of forming a first optical device layer a first prescribed number of times and forming a common layer a second prescribed number of times comprises:
forming a lower cladding layer as a common layer;
forming a lower waveguide layer as a common layer;
forming an upper waveguide layer as a common layer; and
forming an upper cladding layer as a common layer.

9. A method according to claim 8 wherein the first optical device is a laser and the second optical device is a waveguide, the step of performing the steps of forming a first optical device layer a first prescribed number of times and forming a common layer a second prescribed number of times further comprising:
forming a barrier layer as a first optical device layer;
forming a well layer as a first optical device layer;
repeatedly performing the steps of forming a barrier layer and forming a well layer a preset number of times equal to the desired number of wells for the laser; and
forming a barrier layer as a first optical device layer.

10. A method according to claim 6 wherein the first optical device is a laser and the second optical device is an optical amplifier.

11. A method according to claim 10 wherein the step of performing the steps of forming a first optical device layer a first prescribed number of times and forming a common layer a second prescribed number of times further comprises:
forming a laser barrier layer as a first optical device layer;
forming a laser well layer as a first optical device layer;
repeatedly performing the steps of forming a laser barrier layer and forming a laser well layer a first preset number of times equal to a desired number of wells for the laser which exceed a number of wells for the amplifier; and
forming an amplifier and laser barrier layer as a common layer;
forming an amplifier and laser well layer as a common layer;
repeatedly performing the steps of forming an amplifier and laser barrier layer and forming an amplifier and laser well layer a second preset number of times equal to a desired number of wells for the amplifier; and
forming an amplifier and laser barrier layer as a common layer.

12. A method according to claim 3 wherein the first optical device is an active device and the second optical device is a passive device.

13. A method according to claim 3 wherein the first optical device is an active device and the second optical device is an active device.

14. A method according to claim 3 wherein the etching concentration is at least a concentration sufficiently high such that etching occurs at near kinetic limited conditions, and wherein growing occurs as a result of Metalorganic Epitaxial Chemical Vapor Deposition.

* * * * *